United States Patent
Chang et al.

(10) Patent No.: US 11,929,257 B2
(45) Date of Patent: Mar. 12, 2024

(54) ETCHING SOLUTION AND METHOD FOR ALUMINUM NITRIDE

(71) Applicant: VERSUM MATERIALS US, LLC, Tempe, AZ (US)

(72) Inventors: Chung Yi Chang, New Taipei (TW); Wen Dar Liu, Zhubei (TW); Yi-Chia Lee, Hsinchu (TW)

(73) Assignee: Versum Materials US, LLC, Tempe, AZ (US)

( * ) Notice: Subject to any disclaimer, the term of this patent is extended or adjusted under 35 U.S.C. 154(b) by 212 days.

(21) Appl. No.: 17/622,670

(22) PCT Filed: Mar. 10, 2020

(86) PCT No.: PCT/US2020/021837
§ 371 (c)(1),
(2) Date: Dec. 23, 2021

(87) PCT Pub. No.: WO2020/185745
PCT Pub. Date: Sep. 17, 2020

(65) Prior Publication Data
US 2022/0367199 A1    Nov. 17, 2022

Related U.S. Application Data

(60) Provisional application No. 62/894,759, filed on Aug. 31, 2019, provisional application No. 62/816,781, filed on Mar. 11, 2019.

(51) Int. Cl.
*H01L 21/306* (2006.01)
*C09K 13/06* (2006.01)

(52) U.S. Cl.
CPC ........ *H01L 21/30617* (2013.01); *C09K 13/06* (2013.01)

(58) Field of Classification Search
None
See application file for complete search history.

(56) References Cited

U.S. PATENT DOCUMENTS

| | | | |
|---|---|---|---|
| 2006/0148260 A1* | 7/2006 | Zhang | H01L 29/40114 438/692 |
| 2007/0149430 A1 | 6/2007 | Egbe et al. | |
| 2008/0129150 A1 | 6/2008 | Zhang | |
| 2009/0118153 A1 | 5/2009 | Rath et al. | |
| 2009/0143623 A1* | 6/2009 | Katsumata | C07C 255/30 568/589 |
| 2010/0099260 A1* | 4/2010 | Matsumoto | H01L 21/31053 438/693 |
| 2010/0126961 A1* | 5/2010 | Kim | H01L 21/32134 252/79.1 |
| 2010/0160200 A1 | 6/2010 | Seki et al. | |
| 2013/0133688 A1* | 5/2013 | Chiou | H01L 21/02057 134/1 |
| 2014/0038420 A1* | 2/2014 | Chen | H01L 21/823842 438/754 |
| 2015/0031212 A1 | 1/2015 | Shea | |
| 2015/0048053 A1 | 2/2015 | Cordonier et al. | |
| 2016/0130500 A1 | 5/2016 | Chen et al. | |
| 2016/0186106 A1 | 6/2016 | Du et al. | |
| 2017/0145311 A1* | 5/2017 | Liu | H01L 21/30608 |
| 2018/0346811 A1* | 12/2018 | Lee | C03C 25/68 |
| 2019/0103282 A1* | 4/2019 | Ge | H01L 21/02603 |
| 2020/0363725 A1* | 11/2020 | Kamimura | C23G 1/22 |
| 2022/0243150 A1* | 8/2022 | Wang | C11D 7/265 |

FOREIGN PATENT DOCUMENTS

| | | |
|---|---|---|
| EP | 1619557 | 1/2006 |
| EP | 3447109 | 2/2019 |

OTHER PUBLICATIONS

IPOS; Intellectual Property Office of Singapore; Search Report; dated Nov. 30, 2022.
Cimalla, I., et al.; Wet chemical etching of AlN in KOH solution; phys. stal. sol. (c) 3, No. 6, pp. 1767-1770 (2006).
European Patent Office; Supplementary European Search Report; Application No. EP20768945; dated Jun. 14, 2023.

* cited by examiner

*Primary Examiner* — Allan W. Olsen

(74) *Attorney, Agent, or Firm* — William T. Slaven, IV

(57) ABSTRACT

Described herein are etching solutions and method of using the etching solutions suitable for etching aluminum nitride (AlN) from a semiconductor substrate during the manufacture of a semiconductor device comprising AlN and silicon material without harming the silicon material. The etching solution comprises a cationic surfactant, water, a base, and a water-miscible organic solvent.

21 Claims, No Drawings

ETCHING SOLUTION AND METHOD FOR ALUMINUM NITRIDE

CROSS-REFERENCE TO RELATED APPLICATIONS

This application is a National Stage filing under 35 U.S.C. 371 of International Patent Application No. PCT/US20/21837 filed Mar. 10, 2020, which claims priority to U.S. provisional patent application Ser. No. 62/816,781, filed on Mar. 11, 2019, and U.S. provisional patent application Ser. No. 62/894,759, filed Aug. 31, 2019. The entire contents of these applications are incorporated herein by reference in their entirety.

BACKGROUND OF THE INVENTION

Described herein is an etching solution for aluminum nitride removal. More particularly, described herein is an etching solution with excellent selective etching properties for aluminum nitride with respect to other metals and dielectric layers during the manufacture of a microelectronic device.

Group III nitride semiconductors have attracted research efforts in recent years due to their unique properties and potential application for short-wavelength light emitters and detectors as well as for high temperature and high frequency devices. The direct wide band gap of an AlN (6.2 eV) and its piezoelectric properties can be utilized to fabricate unique ultraviolet, high brightness, and long-life light emitting diodes and high frequency microelectromechanical systems (MEMS). Most of these devices are three-dimensional (3D) structures and require a patterning by etching. High etch rates have been achieved by chemical dry etching in chlorine-containing gases. Such process, however, has a reduced selectivity between different alloys in the Group III nitride material system InGaAlN. On the other hand, KOH-based solutions were found to etch AlN highly selective to GaN and AlGaN, and are a fast method to etch sacrificial layers in AlN—AlGaN heterostructures and to create 3D AlN structures. KOH-based and other highly alkaline wet chemical etching, however, often results in silicon roughness at the wafer's back-side by anisotropic etching of silicon. Attempts have been made to address this issue by adding a non-ionic surfactant such as Triton-X100®, but such surfactants tend to turn the solution cloudy at high temperatures. A cloudy solution has reduced transparency to light, indicating that one or more components of the solution are aggregating and that particles may be forming in the solution. Such solutions have the potential to block filters in the manufacturing process and to change the consistency of the concentration of the effective components therein. Accordingly, there is a need in the art for a wet chemical composition for AlN that does not suffer from the above drawbacks.

BRIEF SUMMARY OF THE INVENTION

Described herein is an etching solution suitable for etching aluminum nitride, which comprises, consists essentially of, or consists of: water; a cationic surfactant having a structure represented by Formula A:

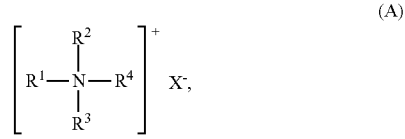

wherein, each of $R^1$, $R^2$, $R^3$, and $R^4$ is independently hydrogen, a substituted or unsubstituted $C_1$-$C_{30}$ alkyl, a substituted or unsubstituted $C_3$-$C_8$ cycloalkyl, a substituted or unsubstituted $C_2$-$C_{30}$ alkenyl, a substituted or unsubstituted aralkyl, a substituted or unsubstituted aryl, or a substituted or unsubstituted heteroaryl, wherein not all of $R^1$, $R^2$, $R^3$, and $R^4$ are hydrogen; and X is an anionic counterion; a water-miscible organic solvent; and a base.

In another embodiment, there is provided a method for at least partially removing aluminum nitride from a microelectronic substrate during manufacture of a microelectronic device, wherein the substrate comprises aluminum nitride and silicon, the method comprising the steps of: contacting the microelectronic substrate with an aqueous etching solution for a time sufficient to at least partially remove the aluminum nitride from the substrate, wherein the aqueous etching solution comprises, consists essentially of, or consists of: water; a cationic surfactant having a structure represented by Formula A:

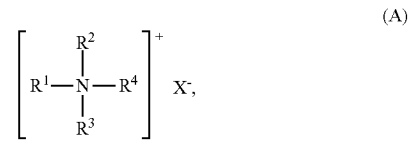

wherein, each of $R^1$, $R^2$, $R^3$, and $R^4$ is independently hydrogen, a substituted or unsubstituted $C_1$-$C_{30}$ alkyl, a substituted or unsubstituted $C_3$-$C_8$ cycloalkyl, a substituted or unsubstituted $C_2$-$C_{30}$ alkenyl, a substituted or unsubstituted aralkyl, a substituted or unsubstituted aryl, or a substituted or unsubstituted heteroaryl, wherein not all of $R^1$, $R^2$, $R^3$, and $R^4$ are hydrogen; and X is an anionic counterion; a water-miscible organic solvent; and a base; and rinsing the substrate.

The embodiments of the invention can be used alone or in combinations with each other.

This invention may provide one or more of the following benefits in any combination: (a) high AlN etching rate; (b) high etching selectivity of AlN/Silicon (100), for examples, greater than 1.5, or greater than 1.8, or greater than 2, or greater than 2.5, or greater than 3, or greater than 3.5, or greater than 4, or greater than 4.5, or greater than 5, or greater than 5.5, or greater than 6, or greater than 6.5, or greater than 7, or greater than 7.5, or from 2 to 15, or from 3 to 12 of AlN/Silicon (100) etching rate; (c) etching selectivity of Si (110)/(100) of a positive amount up to 1.5 or greater; preferably greater than 0.5, or from greater than 0.6 to 1.5, or from 0.8 to 1.5, or from 1 to 1.5; and (d) etching selectivity of Si (111)/(100) of a positive amount up to 0.5, or from 0.2 to about 0.5, or from 0.2 to 0.4, or from 0.3 to 0.5. One or more of these etching selectivities provided by the compositions and method of this invention will provide a roughness-free or nearly roughness-free silicon surface. In contrast, conventional alkaline solutions typically show an etch selectivity of Si (110)/Si (100) of about 0.5. Additional benefits of this invention may include: clear compositions, better compatibility with $SiO_2$ and SiN and these compositions and methods can be used on a wet bench tool. In preferred embodiments, this invention provides both high etching selectivity of AlN/Silicon (100) and etching selectivity of Si (110)/(100) of from 0.8 to 1.5.

Additionally alone or in combination with any other benefits: for some embodiments, the AlN etching rate may be greater than 5,000 Å/min or greater than 10,000 Å/min, or greater than 12,000 Å/min. For some embodiments, the Si(100) etching rate may be less than 4,000 Å/min or less than 3,000 Å/min, or less than 2,500 Å/min. For some embodiments, the Si(110) etching rate may be less than 4,000 Å/min or less than 3,000 Å/min, or less than 2,500 Å/min. For some embodiments, the Si(111) etching rate may be less than 1,000 Å/min or less than 900 Å/min, or less than 800 Å/min. For some embodiments the silicon oxide (SiO2) etching rate may be less than 30 Å/min or less than 25 Å/min, or less than 22 Å/min, or less than 20 Å/min. For some embodiment the silicon nitride (SiN) etching rate may be less than 1 Å/min or less than 0.5 Å/min, or less than 0.3 Å/min.

DETAILED DESCRIPTION

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The present invention relates generally to compositions useful for the removal of aluminum nitride from a microelectronic device having such material thereon.

For ease of reference, "microelectronic device" corresponds to semiconductor substrates, flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" is not meant to be limiting in any way and includes any substrate that will eventually become a microelectronic device or microelectronic assembly.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, the term "barrier material" corresponds to any material used in the art to seal the metal lines, e.g., copper interconnects, to minimize the diffusion of said metal, e.g., copper, into the dielectric material. Preferred barrier layer materials include tantalum, titanium, ruthenium, hafnium, and other refractory metals and their nitrides and silicides.

"Substantially free" is defined herein as less than 2 wt. %, preferably less than 1 wt. %, more preferably less than 0.5 wt. %, and most preferably less than 0.1 wt. %, or less than 1 ppm or less than 100 ppb. "Substantially free" also includes 0.000000 wt. %. The term "free of" means 0.000000 wt. % and less.

As used herein, "about" is intended to correspond to ±5% of the stated value.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.0001 weight percent, based on the total weight of the composition in which such components are employed. Weight percentages are based on the total weight of the composition, that is, 100% by weight. Unless indicated otherwise, all components are listed in their "neat" amounts, meaning excluding any solvent or water, if added as a solvent or aqueous solution to the composition.

The etching composition disclosed herein is an etching solution suitable for at least partially removing aluminum nitride from a microelectronic device during manufacture of the device. In the broad practice of this aspect, the etching solution embodied herein comprises, consists essentially of, or consists of, in effective etching amounts: water; a cationic surfactant having a structure represented by Formula A:

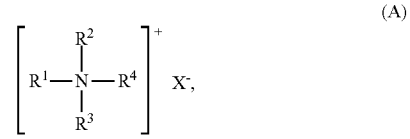

(A)

wherein, each of $R^1$, $R^2$, $R^3$, and $R^4$ is independently hydrogen, a substituted or unsubstituted $C_1$-$C_{30}$ alkyl, a substituted or unsubstituted $C_3$-$C_8$ cycloalkyl, a substituted or unsubstituted $C_1$-$C_{30}$ alkenyl, a substituted or unsubstituted aralkyl, a substituted or unsubstituted aryl, or a substituted or unsubstituted heteroaryl, wherein not all of $R^1$, $R^2$, $R^3$, and $R^4$ are hydrogen; and X is an anionic counterion; a water-miscible organic solvent; and a base.

In some embodiments, the etching solution compositions disclosed herein may be formulated to be substantially free of or free of at least one or more of the following chemical compounds in any combination: fluoride, oxidizers, peroxides such as hydrogen peroxide, and metal-containing oxidizers, organic acids and/or inorganic acids.

Water

The etching solution compositions of the present development are aqueous-based and, thus, comprises water. In the present invention, water functions in various ways such as, for example, to dissolve one or more solid components of the composition, as a hydrolysis medium, as a carrier of the components, as an aid in the removal of residue, as a viscosity modifier of the composition, and as a diluent. Preferably, the water employed in the etching composition is de-ionized (DI) water.

It is believed that, for most applications, water may comprise, for example, from about 40% to about 99% by wt. of water. Other preferred embodiments of the present invention could comprise from about 70% to about 99% by wt. of water. Still other preferred embodiments of the present invention could include water in an amount to achieve the desired weight percent of the other ingredients. Water may be present in any weight percent range defined from the following list of endpoints in any combination: 40, 45, 50, 55, 60, 63, 65, 68, 70, 72, 75, 77, 80, 84, 86, 90, 92, 95, and 99, such as from 77% to about 95% by wt. of water.

Cationic Surfactant

The etching solution compositions of the present development comprise at least one a cationic surfactant having a structure represented by Formula A:

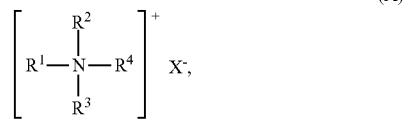

wherein, each of $R^1$, $R^2$, $R^3$, and $R^4$ is independently hydrogen, a substituted or unsubstituted $C_1$-$C_{30}$ alkyl, a substituted or unsubstituted $C_3$-$C_8$ cycloalkyl, a substituted or unsubstituted $C_2$-$C_{30}$ alkenyl, a substituted or unsubstituted aralkyl, a substituted or unsubstituted aryl, or a substituted or unsubstituted heteroaryl, wherein not all of $R^1$, $R^2$, $R^3$, and $R^4$ are hydrogen; and X is an anionic counterion.

As used herein the term "alkyl" or "$C_1$-$C_{30}$ alkyl" means an aliphatic hydrocarbon group that may be straight or branched having about 1 to about 30 carbon atoms in the chain. Preferred alkyl groups have 1 to about 25, or 1 to 20, or 1 to 15 or 1 to 10 carbon atoms in the chain. Branched means that one or more lower alkyl groups such as methyl, ethyl or propyl are attached to a linear alkyl chain. The alkyl may be substituted with one or more "alkyl group substituents" which may be the same or different, and include halo, cyclo-alkyl, alkoxy, alkoxycarbonyl, aralkyloxycarbonyl, or heteroaralkyloxycarbonyl. Representative alkyl groups include methyl, trifluoromethyl, cyclopropylmethyl, cyclopentylmethyl, ethyl, n-propyl, i-propyl, n-butyl, t-butyl, n-pentyl, 3-pentyl, methoxyethyl, sec-butyl, isopentyl, neopentyl, hexyl, 2-hexyl, 3-hexyl, and 3-methylpentyl.

As used herein, an "alkenyl" group refers to an aliphatic carbon group that contains from 2-30 (e.g., 2-18, 2-8, 2-6, or 2-4) carbon atoms and at least one double bond. Like an alkyl group, an alkenyl group can be straight, branched or cyclic or any combination thereof. Examples of an alkenyl group include, but are not limited to, allyl, isoprenyl, 2-butenyl, and 2-hexenyl. An alkenyl group can be optionally substituted with one or more substituents as set forth below.

As used herein, an "aryl" group used alone or as part of a larger moiety as in "aralkyl" refers to monocyclic (e.g., phenyl); bicyclic (e.g., indenyl, naphthalenyl, tetrahydronaphthyl, tetrahydroindenyl); and tricyclic (e.g., fluorenyl tetrahydrofluorenyl, or tetrahydroanthracenyl, anthracenyl) ring systems in which the monocyclic ring system is aromatic or at least one of the rings in a bicyclic or tricyclic ring system is aromatic. The bicyclic and tricyclic groups include benzofused 2-3 membered carbocyclic rings. For example, a benzofused group includes phenyl fused with two or more $C_{4-8}$ carbocyclic moieties. An aryl is optionally substituted with one or more substituents as set forth below.

As used herein, an "aralkyl" or "arylalkyl" group refers to an alkyl group (e.g., a $C_{1-4}$ alkyl group) that is substituted with an aryl group. Both "alkyl" and "aryl" have been defined above. An example of an aralkyl group is benzyl. An aralkyl is optionally substituted with one or more substituents as set forth below.

As used herein, a "cycloalkyl" group refers to a saturated carbocyclic mono- or bicyclic (fused or bridged) ring of 3-10 (e.g., 5-10) carbon atoms. Examples of cycloalkyl groups include cyclopropyl, cyclobutyl, cyclopentyl, cyclohexyl, cycloheptyl, adamantyl, norbornyl, cubyl, octahydroindenyl, decahydro-naphthyl, bicyclo[3.2.1]octyl, bicyclo[2.2.2]octyl, bicyclo[3.3.1]nonyl, bicyclo[3.3.2]decyl, bicyclo[2.2.2]octyl, adamantyl, azacycloalkyl, or ((aminocarbonyl)cycloalkyl)cycloalkyl.

As used herein, the term "heteroaryl" group refers to a monocyclic, bicyclic, or tricyclic ring system having 4 to 18 ring atoms wherein one or more of the ring atoms is a heteroatom (e.g., N, O, S, or combinations thereof) and in which the monocyclic ring system is aromatic or at least one of the rings in the bicyclic or tricyclic ring systems is aromatic. A heteroaryl group includes a benzofused ring system having 2 to 3 rings. For example, a benzofused group includes benzo fused with one or two 4 to 8 membered heterocycloaliphatic moieties (e.g., indolizyl, indolyl, isoindolyl, 3H-indolyl, indolinyl, benzo[b]furyl, benzo[b]thiophenyl, quinolinyl, or isoquinolinyl). Some examples of heteroaryl are azetidinyl, pyridyl, 1H-indazolyl, furyl, pyrrolyl, thienyl, thiazolyl, oxazolyl, imidazolyl, tetrazolyl, benzofuryl, isoquinolinyl, benzthiazolyl, xanthene, thioxanthene, phenothiazine, dihydroindole, benzo[1,3]dioxole, benzo[b]furyl, benzo[b]thiophenyl, indazolyl, benzimidazolyl, benzthiazolyl, puryl, cinnolyl, quinolyl, quinazolyl, cinnolyl, phthalazyl, quinazolyl, quinoxalyl, isoquinolyl, 4H-quinolizyl, benzo-1,2,5-thiadiazolyl, or 1,8-naphthyridyl.

Without limitation, monocyclic heteroaryls include furyl, thiophenyl, 2H-pyrrolyl, pyrrolyl, oxazolyl, thazolyl, imidazolyl, pyrazolyl, isoxazolyl, isothiazolyl, 1,30,4-thiadiazolyl, 2H-pyranyl, 4-H-pranyl, pyridyl, pyridazyl, pyrimidyl, pyrazolyl, pyrazyl, or 1,3,5-triazyl. Monocyclic heteroaryls are numbered according to standard chemical nomenclature.

Without limitation, bicyclic heteroaryls include indolizyl, indolyl, isoindolyl, 3H-indolyl, indolinyl, benzo[b]furyl, benzo[b]thiophenyl, quinolinyl, isoquinolinyl, indolizyl, isoindolyl, indolyl, benzo[b]furyl, bexo[b]thiophenyl, indazolyl, benzimidazyl, benzthiazolyl, purinyl, 4H-quinolizyl, quinolyl, isoquinolyl, cinnolyl, phthalazyl, quinazolyl, quinoxalyl, 1,8-naphthyridyl, or pteridyl. Bicyclic heteroaryls are numbered according to standard chemical nomenclature.

A heteroaryl is optionally substituted with one or more substituents as is set forth below.

The phrase "optionally substituted" is used interchangeably with the phrase "substituted or unsubstituted." As described herein, compounds of the present disclosure can optionally be substituted with one or more substituents, such as are illustrated generally above, or as exemplified by particular classes, subclasses, and species of the present disclosure. As described herein any of the above moieties or those introduced below can be optionally substituted with one or more substituents described herein. Each substituent of a specific group is further optionally substituted with one to three of halo, cyano, oxoalkoxy, hydroxy, amino, nitro, aryl, haloalkyl, and alkyl. For instance, an alkyl group can be substituted with alkylsulfanyl and the alkylsulfanyl can be optionally substituted with one to three of halo, cyano, oxoalkoxy, hydroxy, amino, nitro, aryl, haloalkyl, and alkyl.

In general, the term "substituted," whether preceded by the term "optionally" or not, refers to the replacement of hydrogen radicals in a given structure with the radical of a specified substituent. Specific substituents are described above in the definitions and below in the description of compounds and examples thereof. Unless otherwise indicated, an optionally substituted group can have a substituent at each substitutable position of the group, and when more than one position in any given structure can be substituted with more than one substituent selected from a specified group, the substituent can be either the same or different at every position. A ring substituent, such as a heterocycloalkyl, can be bound to another ring, such as a cycloalkyl, to form a spiro-bicyclic ring system, e.g., both rings share one common atom. As one of ordinary skill in the art will recognize, combinations of substituents envisioned by this present disclosure are those combinations that result in the formation of stable or chemically feasible compounds.

The cationic surfactant represented by Formula A functions to inhibit silicon roughness (including Si(100)) that may occur in the presence of a strong base. Moreover, the cationic surfactant represented by Formula A also allows for aluminum nitride removal at temperatures of up to 100° C. without the composition turning cloudy.

In one embodiment, at least one of $R^1$, $R^2$, $R^3$, and $R^4$ is methyl.

In another embodiment, at least one of $R^1$, $R^2$, $R^3$, and $R^4$ is a substituted or unsubstituted aryl.

In another embodiment, at least one of $R^1$, $R^2$, $R^3$, and $R^4$ is a substituted or unsubstituted aralkyl.

Examples of the cationic portion represented by the structure of Formula A include, for example, benzyltrimethylammonium ($R^1=C_6H_5CH_2$, $R^2=R^3=R^4=CH_3$), behentrimonium ($R^1=CH_3(CH_2)_{21}$, $R^2=R^3=R^4=CH_3$), benzalkonium ($R^1=C_6H_5CH_2$, $R^2=C_nH_{2n+1(n=8, 10, 12, 14, 16, 18)}$, $R^3=R^4=CH_3$), carbethopendecinium ($R^1$=1-ethoxy-1-oxohexadecan-2-yl, $R^2=R^3=R^4=CH_3$), cetrimonium ($R^1=C_{16}H_{33}$, $R^2=R^3=R^4=CH_3$), didecyldimethylammonium ($R^1=R^2=C_{10}H_{21}$, $R^3=R^4=CH_3$), dimethyldioctadecylammonium ($R^1=R^2=C_{18}H_{37}$, $R^3=R^4=CH_3$), dimethyldipropylammonium ($R^1=R^2=C_3H_7$, $R^3=R^4=CH_3$), stearalkonium ($R^1=C_6H_5CH_2$, $R^2=C_{18}H_{37}$, $R^3=R^4=CH_3$), and tetramethylammonium ($R^1=R^2=R^3=R^4=CH_3$).

The $X^-$ portion of the structure of Formula A is an "anionic counterion," which is an anion or an anionic group derived from an organic or mineral acid salt which counterbalances the cationic charge. Examples of moieties from which the anionic counterion is selected include: i) halides such as chloride or bromide; ii) nitrates; iii) sulfonates, including $C_1$-$C_6$ alkylsulfonates: Alk-S(O)$_2$O$^-$ such as methanesulfonate or mesylate and ethanesulfonate; iv) arylsulfonates: Ar—S(O)$_2$O$^-$ such as benzenesulfonate and toluenesulfonate or tosylate; v) citrate; vi) succinate; vii) tartrate; viii) lactate; ix) alkyl sulfites: Alk-O—S(O)O$^-$ such as methyl sulfite and ethyl sulfite; x) aryl sulfites: Ar—O—S(O)O$^-$ such as benzene sulfite and toluene sulfite; xi) alkoxy sulfates: Alk-O—S(O)$_2$O$^-$ such as methoxy sulfate and ethoxy sulfate; xii) aryloxy sulfates: Ar—O—S(O)$_2$O$^-$, xiii) phosphates O=P(OH)$_2$—O$^-$, O=P(O$^-$)$_2$—OHO=P(O$^-$)$_3$, HO—[P(O)(O$^-$)]$_w$—P(O)(O$^-$)$_2$ with w being an integer; xiv) acetate; xv) triflate; and xvi) borates such as tetrafluoroborate, xvii) disulfate (O=)$_2$S(O$^-$)$_2$ or SO$_4^{2-}$ and monosulfate HSO$_4^-$. The anionic counterion, derived from the organic or mineral acid salt, ensures the electrical neutrality of the molecule.

The anionic counterion $X^-$ is preferably a halide, preferably such as chloride, bromide or iodide, a ($C_1$-$C_4$)alkyl sulfate or a ($C_1$-$C_4$)alkyl- or ($C_1$-$C_4$)alkylaryl-sulfonate. However, use may be made of methanesulfonate, phosphate, nitrate, tosylate, an anion derived from an organic acid, such as acetate or lactate, or any other anion compatible with the ammonium containing an ester function. In some embodiments, $X^-$ is not a hydroxide (—OH$^-$).

The anionic counterion $X^-$ is even more particularly tosylate, chloride, bromide, or hydroxide.

Exemplary cationic surfactants represented by the structure of Formula A include alkyl trimethylammonium halides and alkyl trimethylammonium tosylates.

Alkyl trimethylammonium halides include, for example, octyl trimethylammonium bromide, decyl trimethylammonium bromide, dodecyl trimethylammonium bromide, myristyl trimethylammonium bromide, and cetyl trimethylammonium bromide.

Alkyl trimethylammonium tosylates include, for example, octyl trimethylammonium tosylate, decyl trimethylammonium tosylate, dodecyl trimethylammonium tosylate, myristyl trimethylammonium tosylate, and cetyl trimethylammonium tosylate (CTAT).

In some embodiments, the cationic surfactant is selected from, or selected from the group consisting of stearyltrimethylammonium chloride, cetyltrimethylammonium tosylate, octyltrimethylammonium chloride, erucyl bis-(hydroxyethyl)methylammonium chloride, erucyl trimethylammonium chloride cetyltrimethylammonium chloride, cetyltrimethylammonium bromide, myristyltrimethylammonium chloride, myristyltrimethylammonium bromide, dodecyltrimethylammonium chloride, dodecyltrimethylammonium bromide, decyltrimethylammonium chloride, decyltrimethylammonium bromide, and combinations thereof.

It is believed that the amount of the cationic surfactant compound(s) in the etching composition of the present development may be from about 0.0001% to about 5.0% by weight of the composition. Preferably the cationic surfactant compound(s) comprises from about 0.001% to about 2.0% by weight and, most preferably, from about 0.005% to about 1.0% by weight of the composition, or within any range of weight % defined by the following endpoints in any combination: 0.0001, 0.001, 0.005, 0.01, 0.02, 0.03, 0.05, 0.07, 0.09, 0.1, 0.15, 0.2, 0.3, 0.5, 0.7, 0.9, 1, 1.5, 2, 2.5, 3, 3.5, 4, 4.5, and 5.

Alkaline/Base Component

The etching solution compositions of the present invention comprise a base such as, for example, a quaternary ammonium compound (such as, for example, a tetraalkylammonium hydroxide), an organic amine, an alkali metal hydroxide, or mixtures thereof. The base may aide the dissolution of the AlN.

Tetraalkylammonium hydroxide bases contemplated herein include compounds having the formula $NR^aR^bR^cR^dOH$, wherein $R^a$, $R^b$, $R^c$ and $R^d$ may be the same as or different from one another and are selected from or selected from the group consisting of hydrogen, straight-chained or branched $C_1$-$C_6$ alkyl (e.g., methyl, ethyl, propyl, butyl, pentyl, and hexyl), and substituted or unsubstituted $C_6$-$C_{10}$ aryl, e.g., benzyl. Tetraalkylammonium hydroxides that are commercially available include tetraethylammonium hydroxide (TEAH), tetramethylammonium hydroxide (TMAH), tetrapropylammonium hydroxide (TPAH), tetrabutylammonium hydroxide (TBAH), tributylmethylammonium hydroxide (TBMAH), benzyltrimethylammonium hydroxide (BTMAH), and combinations thereof, may be used. Tetraalkylammonium hydroxides which are not commercially available may be prepared in a manner analogous to the published synthetic methods used to prepare TMAH, TEAH, TPAH, TBAH, TBMAH, and BTMAH, which are known to one ordinary of skill in the art. Another widely used quaternary ammonium base is choline hydroxide.

Illustrative organic amines that may be useful in specific compositions include species having the general formula NR'R"R'", wherein R', R" and R'" may be the same as or different from one another and are selected from, or selected from the group consisting of hydrogen, straight-chained or branched $C_1$-$C_6$ alkyl (e.g., methyl, ethyl, propyl, butyl, pentyl, and hexyl) and straight-chained or branched $C_1$-$C_6$ alcohol (e.g., methanol, ethanol, propanol, butanol, pentanol, and hexanol). Most preferably, at least one of R', R" and R'" is a straight-chained or branched $C_1$-$C_6$ alcohol. Examples include, without limitation, aminoethylethanolamine, N-methylaminoethanol, aminoethoxyethanol, dimethylaminoethoxyethanol, diethanolamine, N-methyldiethanolamine, monoethanolamine, triethanolamine, 1-amino-2-propanol, 2-amino-1-butanol, isobutanolamine, triethylenediamine, other $C_1$-$C_8$ alkanolamines and combinations thereof.

Illustrative examples of alkali metal hydroxides includes lithium hydroxide, sodium hydroxide, and potassium hydroxide.

In some embodiments, the base employed is potassium hydroxide.

It is believed that the amount of the strong base in the etching composition of the present development may be from about 0.1% to about 60% by weight of the composition. Preferably the strong base comprises from about 1.0% to about 30% by weight and, most preferably, from about 1.0% to about 20% by weight of the composition. Other useful ranges of the base can be selected from the following list of weight percent endpoints in any combination: 0.1, 0.5, 1, 3, 5, 7, 10, 12, 15, 17, 20, 22, 25, 28, 30, 35, 38, 40, 45, 50, 55 and 60.

Water-Miscible Solvent

The etching solution compositions of the present invention include one or more water-miscible organic solvents. The water-miscible organic solvent functions at least in part to make the cationic surfactants dissolve in alkaline solution to result in a clear solution as well as improve the silicon surface roughness. The solvent may also function to adjust the solution's polarity. Examples of water-miscible organic solvents that can be used are ethylene glycol, propylene glycol (PG), 1,4-butanediol, tripropylene glycol methyl ether, propylene glycol propyl ether, diethylene glycol n-butyl ether (commercially available under the trade designation Dowanol DB), hexyloxypropylamine, poly(oxyethylene)diamine, dimethylsulfoxide, tetrahydrofurfuryl alcohol (THFA), glycerol, alcohols, sulfoxides, 3-methoxy-3-methyl-1-butanol, or mixtures thereof.

In certain embodiments, the water-miscible organic solvent comprises a hydroxyl group-containing water-miscible solvent. Classes of hydroxyl group-containing water-miscible solvents include, but are not limited to, alkane diols and polyols (including, but not limited to, alkylene glycols), glycols, alkoxyalcohols (including but not limited to glycol monoethers), saturated aliphatic monohydric alcohols, unsaturated non-aromatic monohydric alcohols, and low molecular weight alcohols containing a ring structure.

Examples of water soluble alkane diols and polyols such as ($C_2$-$C_{20}$) alkanediols and ($C_3$-$C_{20}$) alkanetriols including, but are not limited to, 2-methyl-1,3-propanediol, 1,3-propanediol, 2,2-dimethyl-1,3-propanediol, 1,4-butanediol, 1,3-butanediol, 1,2-butanediol, 2,3-butanediol, and pinacol.

Examples of water soluble alkylene glycols include, but are not limited to, ethylene glycol, propylene glycol, diethylene glycol, dipropylene glycol, triethylene glycol and tetraethyleneglycol.

Examples of water soluble alkoxyalcohols include, but are not limited to, 3-methoxy-3-methyl-1-butanol, 3-methoxy-1-butanol, 1-methoxy-2-butanol, and water soluble glycol monoethers.

Examples of water soluble glycol monoethers include, but are not limited to, ethylene glycol monomethyl ether, ethylene glycol monoethyl ether, ethylene glycol mono n-propyl ether, ethylene glycol monoisopropyl ether, ethylene glycol mono n-butyl ether, diethylene glycol monomethyl ether, diethylene glycol monoethyl ether, diethylene glycol monobutylether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether (DPM), dipropylene glycol monoethyl ether, dipropylene glycol mono-n-propyl ether, tripropylene glycol monoethyl ether, tripropylene glycol monomethyl ether and ethylene glycol monobenzyl ether, diethylene glycol monobenzyl ether, and mixtures thereof.

Examples of water soluble saturated aliphatic monohydric alcohols include, but are not limited to methanol, ethanol, n-propyl alcohol, isopropyl alcohol, 1-butanol, 2-butanol, isobutyl alcohol, tert-butyl alcohol, 2-pentanol, t-pentyl alcohol, 1-hexanol, and mixtures thereof.

Examples of water soluble unsaturated non-aromatic monohydric alcohols include, but are not limited to allyl alcohol, propargyl alcohol, 2-butenyl alcohol, 3-butenyl alcohol, 4-penten-2-ol, and mixtures thereof.

Examples of water soluble, low molecular weight alcohols containing a ring structure include, but are not limited to, alpha-terpineol, tetrahydrofurfuryl alcohol, furfuryl alcohol, 1,3-cyclopentanediol, and mixtures thereof.

It is believed that, for most applications, the amount of water-miscible organic solvent, if present, may comprise from about 0.001 to about 75, or from about 5 to about 75, or from about 0.001 to about 50, or from 5 to about 50, or from about 0.001 to about 30, or from about 5 to about 30% by weight of the composition. It is believed that, for most applications, the amount of water-miscible organic solvent, if present, may comprise from about 0.1 to 20% by weight of the composition, or from 0.2 to about 10% by weight or from about 0.3% to about 8% by weight of the composition. Alternatively, the composition may comprise any amount of water-miscible organic solvent in a weight % range selected from the following list of endpoints in any combination: 0.001, 0.01, 0.1, 0.2, 0.3, 0.4, 0.5, 0.6, 0.7, 0.8, 0.9, 1.0, 1.5, 2, 3, 4, 5, 7, 9, 10, 12, 15, 17, 20, 50 and 75.

Metal Chelating Agent (Optional)

Another optional ingredient that can be used in the etching compositions disclosed herein is a metal chelating agent which typically functions to increase the capacity of the composition to retain metals in solution and to enhance the dissolution of metallic residues. Typical examples of chelating agents useful for this purpose are the following organic acids and their isomers and salts: (ethylenedinitrilo) tetraacetic acid (EDTA), butylenediaminetetraacetic acid, (1,2-cyclohexylenedinitrilo-)tetraacetic acid (CyDTA), diethylenetriaminepentaacetic acid (DETPA), ethylenediaminetetrapropionic acid, (hydroxyethyl)ethylenediaminetriacetic acid (HEDTA), N, N,N',N'-ethylenediaminetetra (methylenephosphonic) acid (EDTMP), triethylenetetraminehexaacetic acid (TTNA), 1,3-diamino-2-hydroxypropane-N,N,N',N'-tetraacetic acid (DHPTA), methyliminodiacetic acid, propylenediaminetetraacetic acid, nitrolotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, catechol, gallic acid, propyl gallate, pyrogallol, 8-hydroxyquinoline, and cysteine. Preferred chelating agents are aminocarboxylic acids such as EDTA, CyDTA and aminophosphonic acids such as EDTMP.

It is believed that, for most applications, if present the chelating agent may be present in the composition in an amount of from 0 to about 10% by weight, preferably in an amount of from about 0.1 to 10% or from about 0.1 to 5% by weight of the composition.

In some embodiments the compositions of this invention may be free of or substantially free of any or all of the above-listed metal chelating agents added to the composition.

Corrosion Inhibitor (Optional)

The compositions of the present invention optionally comprise at least one corrosion inhibitor. Corrosion inhibitors serve to react with the substrate surface being cleaned, which may be a metal, particularly copper, or a nonmetal, to passivate the surface and prevent excessive etching.

Any corrosion inhibitor known in the art for similar applications may be used. Examples of corrosion-inhibitors include aromatic hydroxyl compounds, acetylenic alcohols, carboxyl group-containing organic compounds and anhydrides thereof, and triazole compounds.

Exemplary aromatic hydroxyl compounds include phenol, cresol, xylenol, pyrocatechol, resorcinol, hydroquinone, pyrogallol, 1.2.4-benzenetriol, salicyl alcohol, p-hydroxybenzyl alcohol, o-hydroxybenzyl alcohol, p-hydroxyphenethyl alcohol, p-aminophenol, m-aminophenol, diaminophenol, amino resorcinol, p-hydroxybenzoic acid, o-hydroxybenzoic acid, 2,4-dihydroxybenzoic acid, 2-5-dihydroxybenzoic acid, 3,4-dihydroxybenzoic acid and 3,5-dihydroxybenzoic acid.

Exemplary acetylenic alcohols include 2-butyne-1,4-diol, 3,5-dimethyl-1-hexyn-3-ol, 2-methyl-3-butyn-2-ol, 3-methyl-1-pentyn-3-ol, 3,6-dimethyl-4-octyn-3,6-diol, 2,4-7,9-tetramethyl-5-decyne-4,7-diol and 2,5-dimethyl-3-hexyne 2,5-diol.

Exemplary carboxyl group-containing organic compounds and anhydrides thereof include formic acid, acetic acid, propionic acid, butyric acid, isobutyric acid, oxalic acid, malonic acid, succinic acid, glutaric acid, maleic acid, fumaric acid, benzoic acid, phthalic acid, 1,2,3-benzenetricarboxylic acid, glycolic acid, lactic acid, maleic acid, acetic anhydride and salicylic acid.

Exemplary triazole compounds include benzotriazole, o-tolyltriazole, m-tolyltriazole, p-tolyltriazole, carboxybenzotriazole, 1-hydroxybenzotriazole, nitrobenzotriazole and dihydroxypropylbenzotriazole.

In an exemplary embodiment, the corrosion inhibitors include one or more of benzotriazole, carboxybenzotriazole, amino-benzotriazole, D-fructose, t-butyl catechol, L-ascorbic acid, vanillin, salicylic acid, diethyl hydroxylamine (DEHA), and poly(ethyleneimine).

In other embodiments, the corrosion inhibitor is a triazole and is at least one of benzotriazole, o-tolyltriazole, m-tolyltriazole, and p-tolyltriazole.

It is believed that for most applications, if present, the corrosion-inhibitor may comprise from about 0.1 wt. % to about 15 wt. % of the composition, or from about 0.1 wt. % to about 10 wt. %, or from about 0.5 wt. % to about 5 wt. %, or from about 0.1 wt. % to about 1 wt. %, or from about 0.5 wt. % to about 5 wt. %, or from about 5 wt. % to about 15 wt. %, or from about 7 to about 12 wt. % of the composition.

In some embodiments the compositions of this invention may be free of or substantially free of any or all of the above-listed corrosion inhibitors added to the composition.

Other commonly known components such as dyes, biocides etc. may be included in the etching composition in conventional amounts, for example, amounts up to a total of about 5 weight % of the composition.

pH

The pH of the etching compositions of this development may be varied to produce a composition optimized for the intended end use. In general, the pH will be basic, e.g., greater than about 9.0 and, more preferably, 10.0 or greater. Most preferably, the pH of the etching compositions may be 12 or greater. In use, it is preferred that the pH of the etching compositions be at least about 12, with 14 preferred.

The range of weight percent ratios of the components may cover all possible concentrated or diluted embodiments described herein. Towards that end, in one embodiment, a concentrated etching composition is provided that can be diluted for use as an etching solution. A concentrated composition, or "concentrate," advantageously permits a user, e.g., a process engineer, to dilute the concentrate to the desired strength and pH at the point of use. Dilution of the concentrated etching composition may be in a range from about 1:1 to about 2500:1, preferably about 5:1 to about 200:1, wherein the etching composition is diluted at or just before the tool with solvent, e.g., deionized water. It is to be appreciated by one skilled in the art that following dilution, the range of weight percent ratios of the components disclosed herein should remain unchanged.

The etching solution composition of the present invention is typically prepared by mixing the components together in a vessel at room temperature until all solids have dissolved in the aqueous-based medium.

Method

In another aspect there is provided a method for at least partially removing aluminum nitride from a microelectronic substrate during manufacture of a microelectronic device, wherein the substrate comprises aluminum nitride and silicon, the method comprising the steps of: contacting the microelectronic substrate with an aqueous etching solution for a time sufficient to at least partially remove the aluminum nitride from the substrate, wherein the aqueous etching solution comprises, consists essentially of, or consists of: water; a cationic surfactant having a structure represented by Formula A:

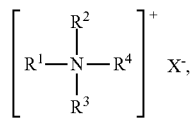

wherein, each of $R^1$, $R^2$, $R^3$, and $R^4$ is independently hydrogen, a substituted or unsubstituted $C_1$-$C_{30}$ alkyl, a substituted or unsubstituted $C_3$-$C_8$ cycloalkyl, a substituted or unsubstituted $C_2$-$C_{30}$ alkenyl, a substituted or unsubstituted aralkyl, a substituted or unsubstituted aryl, or a substituted or unsubstituted heteroaryl, wherein not all of $R^1$, $R^2$, $R^3$, and $R^4$ are hydrogen; and X is an anionic counterion; a water-miscible organic solvent; and a base; and rinsing the substrate. In some embodiments, there may be at least one additional step including a drying step.

The contacting step can be carried out by any suitable means such as, for example, immersion, spray, or via a single wafer process.

The rinsing step is carried out by any suitable means, for example, rinsing the substrate with de-ionized water by immersion or spray techniques. In preferred embodiments, the rinsing step is carried out employing a mixture of de-ionized water and a water-miscible organic solvent such as, for example, isopropyl alcohol.

The drying step is carried out by any suitable means, for example, isopropyl alcohol (IPA) vapor drying or by centripetal force.

The microelectronic substrate used in the method of this invention may further comprise films, layers and/or patterned areas comprising one or more of the following: silicon dioxide, silicon nitride, metals thereon in addition to films, layers and/or patterned areas of the aluminum nitride and/or silicon (in addition to the silicon substrate).

The term "etch" or "etching" as used herein refers to a process utilizing the etching phenomenon, and it naturally includes removal of aluminum nitride. Thus, the microelectronic device may further include electronic devices of which production process has a step of dissolving off of the entirety of the aluminum nitride by an etching solution, even if no aluminum nitride remains on the final product.

Treatment of an aluminum nitride layer or partial layer with an etching solution according to the invention will usually be accomplished by a dipping method, but other methods such as spraying or spin etching may be used for the treatment. The conditions for treatment by dipping cannot be specified for all cases since they will differ depending on the components of the etching solution and the film thickness of the aluminum nitride, but generally the treatment temperature may be from about 20 to 100° C. and more preferably from about 30-80° C. or 20-60° C. Such treatment may, in some embodiments, be carried out while applying ultrasonic waves.

"At least partial removal" of the aluminum nitride from the microelectronic device corresponds to at removal of at least 90% of the material, preferably at least 95% removal. Most preferably, at least 99% removal using the compositions of the present development.

Following the achievement of the desired removal action, the etching solution of the present development is readily removed from the device to which it has previously been applied, e.g., by rinse, wash, or other removal step(s), as may be desired and efficacious in a given end use application of the compositions of the present invention. For example, the device may be rinsed with a rinse solution including deionized water and/or dried (e.g., spin-dry, N2, vapor-dry etc.). Thus, another aspect of the present development relates to a two-step method of removing aluminum nitride from the surface of a microelectronic device. The first step involves the contacting of the aluminum nitride-containing device with the etching solutions of the present development for a time of from about 0.5 minute to about 60 minutes, at a temperature in a range of from about 20° C. to about 100° C., preferably about 20° C. to about 60° C. Generally speaking, the higher the temperature, the higher the etch rate, thus temperature can be used as a variable to control etch rate. Thereafter, the device is contacted with a deionized water rinse at temperature in a range from about 20° C. to about 30° C. for 15 seconds to about 300 seconds, for example.

The features and advantages are more fully shown by the illustrative examples discussed below.

EXAMPLES

General Procedure for Preparing the Etching Compositions

All compositions which are the subject of the present Examples were prepared by mixing 100 g of material in a 250 mL beaker with a 1" Teflon-coated stir bar. For compositions without a water-miscible organic solvent, the first material added to the beaker was deionized (DI) water. The remaining components can then be added in any order.

For compositions that include a water-miscible organic solvent, the composition is mixed as stated above, but the solvent such as, for example, 3-methoxy-3-methyl-1-butanol ("MMB"), is preferably added to the water before the cationic surfactant is introduced.

Compositions of the Substrate

Each substrate used in the present Examples to determine the etch rate of aluminum nitride comprised an aluminum nitride film on a silicon wafer. To determine the etch rate for the various silicon orientations, silicon (100) wafers, silicon (110) wafers and silicon (111) wafers were used.

Processing Conditions

Etching tests were run using 100 g of the etching compositions in a 150 ml beaker with a ½" round Teflon stir bar set at 500 rpm. The etching compositions were heated to the desired temperature indicated below on a hot plate if necessary. Wafer segments approximately 1"×1" in size were immersed in the compositions under the following set of conditions.

5 minutes @ 65° C.
5 minutes @ 75° C.
10 minutes @ 65° C.
10 minutes @ 75° C.

The segments were then rinsed for 3 minutes in a DI water overflow bath and subsequently dried using filtered nitrogen.

Etch Rate Measurement Procedure

The aluminum nitride etch rates were estimated from changes in the thickness before and after etching and determined by optical microscopy (OM) measurement using a Nanospec® spectrometer. The etch rates for the wafer pieces of silicon (100), or silicon (110), or silicon (111) were determined by measuring the weight of the pieces before and after contacting the wafer pieces with the compositions identified in the tables below, rinsing and drying as described above. A graph of the change in thickness (or weight) as a function of immersion time was made for the wafers and the etch rates in Angstroms/min was determined from the slope of the curve. (For the weight measurements, the change in weight was translated into Å/min by taking into account the volume and area of each wafer piece tested.) This invention describes a new composition which gives a high etching rate of AlN without silicon roughness. Moreover, the cloud phenomenon (which is when a solution becomes cloudy) is not observed at elevated temperatures. Roughness and smoothness was determined by visual assessments using optical microscopy and SEM imaging. As reported in the tables below a surface was considered "rough" if it was it was not smooth. "Serious roughness" was less smooth than "rough" and "damaged" was worse than serious roughness.

Different approaches were evaluated to reduce silicon roughness and cloud phenomenon formation. These include investigating solvent effects or solvent to water ratios and cloud phenomenon sensitivity to surfactant types.

Tables 1 and 2 show the performance of various compositions in terms of "cloud" formation and silicon protection.

TABLE 1

Evaluation of Non-Ionic Surfactant (Sulfonyl ® 485 from Evonik) in a KOH Solution

|  | 1D | 1C |
|---|---|---|
| KOH | 11.00 | 11.00 |
| DIW | 89.00 | 89.00 |
| Surfynol ® 485 |  | 0.050 |
| Cloudy phenomenon | Clear solution | Cloudy solution |
| Si(100) damage | Rough | Smooth |

Table 1 shows that a non-ionic surfactant can inhibit the roughening of silicon but lead to cloud phenomenon. The KOH value is "neat" based on 100% KOH (no water). The cloud point of solution 1E is 40° C. Solution 1D did not exhibit "cloudy" phenomenon at any temperature.

TABLE 2

Evaluation of Cationic Surfactant (CTAT) in a KOH Solution

| solution | 1D | 1E |
|---|---|---|
| KOH | 11.00 | 11.00 |
| DIW | 89.00 | 89.00 |
| CTAT |  | 0.050 |
| Cloudy phenomenon | clear solution | clear solution |
| Si(100) damage | Seriously damaged | smooth |
| Si(100)E/R | 12074 | 2398 |
| Si(110)E/R | 6368 | 2772 |
| Si(111)E/R | 1225 | 768 |

Table 2 shows that a cationic surfactant can inhibit roughening of the silicon surface without "cloud" formation at 65° C.

Table 3 shows the impact of different solvents on silicon surface roughening.

TABLE 3

| Solution | 1D | 1Y | 1Z | 2H | 2I | 2J | 1K |
|---|---|---|---|---|---|---|---|
| KOH | 11 | 11 | 11 | 11 | 11 | 11 | 11 |
| DIW | 89 | 79 | 79 | 79 | 79 | 79 | 79 |
| DPM |  | 10 |  |  |  |  |  |
| MMB |  |  | 10 |  |  |  |  |
| THFA |  |  |  | 10 |  |  |  |
| DEHA |  |  |  |  | 10 |  |  |
| PG |  |  |  |  |  | 10 |  |
| Glycerol |  |  |  |  |  |  | 10 |
| Cloudy phenomenon | clear solution | clear solution | CP = 50° C. | clear solution | clear solution | clear solution | clear solution |
| Silicon 100 E/R | 12074 | 4331 | 2298 | No test | No test | 7529 | 7867 |
| Silicon 110 E/R | 6368 | 2920 | 1245 |  |  | 3615 | 5107 |
| Silicon 111 E/R | 1225 | 941 | 661 |  |  | 1349 | 1597 |
| Silicon damage | Serious roughness | Smooth | Damaged | Serious roughness | Damaged | Serious roughness | Damaged |
| Si (110)/Si(100) | 0.53 | 0.67 | 0.54 |  |  | 0.48 | 0.65 |
| Si (111)/Si(100) | 0.10 | 0.22 | 0.27 |  |  | 0.18 | 0.20 |

DPM was found to be a good solvent to protect silicon against surface roughening. For some of the examples the solvent decreased the silicon etch rate; however, some solvents had a negative impact on AlN etch rate.

Table 4 shows the effect of time and temperature on AlN etching for various formulations. Defect counts were determined by visually counting from SEMs, the number of pyramids or other defects in a unit area on a wafer.

| Solution | KOH (11%) | 1T | 1T | 2N |
|---|---|---|---|---|
| KOH | 11 | 11 | 11 | 11 |
| DIW | 89 | 88 | 88 | 88 |
| CTAT |  | 0.05 | 0.05 | 0.1 |
| MMB |  | 0.95 | 0.95 |  |
| 2-Butanol |  |  |  | 1.9 |
| Total weight | 100 | 100 | 100 | 100 |
| Temperature | 65° C. | 65° C. | 75° C. | 65° C. |
| AlN OM result Time = 1 min | Counts of defect were about 40~50 per unit area | Counts of defect were about 30~40 per unit area | Counts of defect were about 10~20 per unit area | Counts of defect were about 10~20 per unit area |
| AlN OM result Time = 3 min | Counts of defect were about 10~20 per unit area | Counts of defect were about 10~20 per unit area | Defect was free under the condition | Counts of defect were about 0~10 per unit area |

Unit area was 0.01 cm$^2$

Increasing the temperature may increase the etching rate of AlN which can be observed less crystalline of AlN at 1 min and fully removed at 3 min.

Table 5 shows the impact of different solvents on silicon and AlN etching selectivity The etching rate data of AlN was measured by spectrometer, the nano spectrophotometer was used in this case.

TABLE 5

| Solvent effect (10% usage) | E/R(A/min) | E/R(A/min) | | | Etching selectivity | | |
|---|---|---|---|---|---|---|---|
| Film type | AlN | Si(100) | Si(110) | Si(111) | Si(110)/Si(100) | Si(111)/Si(100) | AlN/Si(100) |
| Water | 18241 | 12074 | 6367 | 1989 | 0.53 | 0.16 | 1.51 |
| Glycerol | 18441 | 7867 | 5107 | 1597 | 0.65 | 0.2 | 2.34 |
| PG | 15511 | 7529 | 3615 | 1349 | 0.48 | 0.18 | 2.06 |
| DPM | 13598 | 4331 | 2920 | 941 | 0.67 | 0.22 | 3.14 |
| MMB | 11430 | 2298 | 1245 | 661 | 0.54 | 0.27 | 4.97 |

As shown, the AlN etching rate changes with the solvent selected. When the Si(100) etch rate is much higher than the Si(111) etch rate, pyramidal shape etching profile results which provides for high surface roughness.

Table 6 shows the impact of cationic surfactant on silicon and AlN etching selectivity

TABLE 6

| Additive effect | E/R(A/min) | E/R(A/min) | | | Etching selectivity | | |
|---|---|---|---|---|---|---|---|
| Formulation | AlN | Si(100) | Si(110) | Si(111) | Si(110)/Si(100) | Si(111)/Si(100) | AlN/Si(100) |
| 1D | 18241 | 12074 | 6367 | 1989 | 0.53 | 0.16 | 1.51 |
| 1T | 18310 | 2398 | 2772 | 768 | 1.16 | 0.32 | 7.64 |

High AlN etching rate and high etching selectivity of AlN/Si was achieved by formulations of this invention. Additionally, less Si roughness was achieved as indicated by the increase in Si(110)/Si(100) where the ratio is approximately equal to or greater than 1, or more preferably greater than 1.

Table 7 shows the impact of cationic surfactant on silicon dioxide and silicon nitride etching.

TABLE 7

| Formulation | SiO$_2$ E/R | SiN E/R |
|---|---|---|
| 1D | 23.8 | 0.43 |
| 1T | 19.0 | 0.15 |

The etch rates for the silicon oxide and silicon nitride reported in Table 7 were determined using wafers having either a layer of silicon oxide or silicon nitride thereon and using the same procedures described above. The etch rates were determined using Nanospec® spectrometer.

The foregoing description is intended primarily for purposes of illustration. Although the invention has been shown and described with respect to an exemplary embodiment thereof, it should be understood by those skilled in the art that the foregoing and various other changes, omissions, and additions in the form and detail thereof may be made therein without departing from the spirit and scope of the invention.

The invention claimed is:

1. An etching solution suitable for at least partially removing aluminum nitride from a microelectronic device during manufacture of the device, the solution comprising:
water;
a cationic surfactant having a structure represented by Formula A:

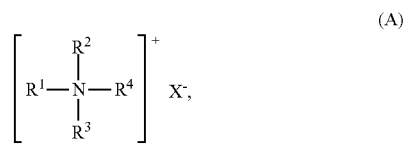

wherein, each of $R^1$, $R^2$, $R^3$, and $R^4$ is independently hydrogen, a substituted or unsubstituted $C_1$-$C_{30}$ alkyl, a substituted or unsubstituted $C_3$-$C_8$ cycloalkyl, a substituted or unsubstituted $C_2$-$C_{30}$ alkenyl, a substituted or unsubstituted aralkyl, a substituted or unsubstituted aryl, or a substituted or unsubstituted heteroaryl, wherein not all of $R^1$, $R^2$, $R^3$, and $R^4$ are hydrogen; and
X is an anionic counterion;
a water-miscible organic solvent; and
greater than 10% by weight of base comprising potassium hydroxide,
wherein the etching solution is free of solid materials, fluoride, oxidizers, peroxides, inorganic acids, and organic acids.

2. The etching solution of claim 1 wherein the anionic counterion is selected from chloride, bromide, iodide, a nitrate, a sulfonate, citrate, succinate, tartrate, lactate, an alkyl sulfate, an aryl sulfate, an alkoxy sulfate, an aryloxy sulfate, an alkyl sulfite, an aryl sulfite, an alkoxy sulfite, an aryloxy sulfite, acetate, triflate, a borate, and a disulfate.

3. The etching solution of claim 2 wherein the anionic counterion is chloride.

4. The etching solution of claim 3 wherein the anionic counterion is bromide.

5. The etching solution of claim 1 wherein the anionic counterion is the sulfonate.

6. The etching solution of claim 5 wherein the sulfonate is tosylate.

7. The etching solution of claim 1 wherein at least one of $R^1$, $R^2$, $R^3$, and $R^4$ is methyl.

8. The etching solution of claim 1 wherein the cation of the cationic surfactant is selected from benzyltrimethylammonium ($R^1$=$C_6H_5CH_2$, $R^2$=$R^3$=$R^4$=$CH_3$), behentrimonium ($R^1$=$CH_3(CH_2)_{21}$, $R^2$=$R^3$=$R^4$=$CH_3$), benzalkonium ($R^1$=$C_6H_5CH_2$, $R^2$=$C_nH_{2n+1(n=8, 10, 12, 14, 16, 18)}$, $R^3$=$R^4$=$CH_3$), carbethopendecinium ($R^1$=1-ethoxy-1-oxohexadecan-2-yl, $R^2$=$R^3$=$R^4$=$CH_3$), cetrimonium ($R^1$=$C_{16}H_{33}$, $R^2$=$R^3$=$R^4$=$CH_3$), didecyldimethylammonium ($R^1$=$R^2$=$C_{10}H_{21}$, $R^3$=$R^4$=$CH_3$), dimethyldioctadecylammonium ($R^1$=$R^2$=$C_{18}H_{37}$, $R^3$=$R^4$=$CH_3$), dimethyldipropylammonium ($R^1$=$R^2$=$C_3H_7$, $R^2$=$CH_3$), stearalkonium ($R^1$=$C_6H_5CH_2$, $R^2$=$C_{18}H_{37}$, $R^3$=$R^4$=$CH_3$), and tetramethylammonium ($R^1$=$R^2$=$R^3$=$R^4$=$CH_3$).

9. The etching solution of claim 1 wherein at least one of $R^1$, $R^2$, $R^3$, and $R^4$ is a substituted or unsubstituted aryl.

10. The etching solution of claim 1 wherein at least one of $R^1$, $R^2$, $R^3$, and $R^4$ is a substituted or unsubstituted aralkyl.

11. The etching solution of claim 1 wherein the cationic surfactant is an alkyl trimethylammonium tosylate.

12. The etching solution of claim 11 wherein the alkyl trimethylammonium tosylate is selected from octyl trimethylammonium tosylate, decyl trimethylammonium tosylate, dodecyl trimethylammonium tosylate, myristyl trimethylammonium tosylate, and cetyl trimethylammonium tosylate.

13. The etching solution of claim 12 wherein the alkyl trimethylammonium tosylate is cetyl trimethylammonium tosylate.

14. The etching solution of claim 1 wherein the cationic surfactant is selected from stearyltrimethylammonium chloride, cetyltrimethylammonium tosylate, octyltrimethylammonium chloride, erucyl bis-(hydroxyethyl)methylammonium chloride, erucyl trimethylammonium chloride cetyltrimethylammonium chloride, cetyltrimethylammonium bromide, myristyltrimethylammonium chloride, myristyltrimethylammonium bromide, dodecyltrimethylammonium chloride, dodecyltrimethylammonium bromide, decyltrimethylammonium chloride, decyltrimethylammonium bromide, and mixtures thereof.

15. The etching solution of claim 1 wherein the water-miscible organic solvent is selected from ethylene glycol, propylene glycol, 1,4-butanediol, tripropylene glycol methyl ether, propylene glycol propyl ether, diethylene glycol n-butyl ether, hexyloxypropylamine, poly(oxyethylene)diamine, dimethylsulfoxide, tetrahydrofurfuryl alcohol, glycerol, alcohols, sulfoxides, and mixtures thereof.

16. The etching solution of claim 1 wherein the water-miscible organic solvent is selected from 3-methoxy-3-methyl-1-butanol, 3-methoxy-1-butanol, and 1-methoxy-2-butanol.

17. The etching solution of claim 1 wherein the base further comprises a quaternary ammonium compound, an organic amine, and mixtures thereof.

18. The etching solution of claim 1 wherein the base consists of alkali metal hydroxide.

19. The etching solution of claim 18 wherein the base consists of KOH.

20. The etching solution of claim 1 comprising:
water;
cetyltrimethylammonium tosylate;
3-methoxy-3-methyl-1-butanol; and
KOH.

21. A method for at least partially removing aluminum nitride from a microelectronic substrate during manufacture of a microelectronic device, wherein the substrate comprises aluminum nitride and silicon, the method comprising the steps of:
contacting the microelectronic substrate with an aqueous etching solution for a time sufficient to at least partially remove the aluminum nitride from the substrate, wherein the aqueous etching solution comprises
water;
a cationic surfactant having a structure represented by Formula A:

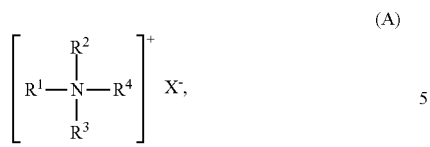 (A)

wherein, each of $R^1$, $R^2$, $R^3$, and $R^4$ is independently hydrogen, a substituted or unsubstituted $C_1$-$C_{30}$ alkyl, a substituted or unsubstituted $C_3$-$C_8$ cycloalkyl, a substituted or unsubstituted $C_2$-$C_{30}$ alkenyl, a substituted or unsubstituted aralkyl, a substituted or unsubstituted aryl, or a substituted or unsubstituted heteroaryl, wherein not all of $R^1$, $R^2$, $R^3$, and $R^4$ are hydrogen; and X is an anionic counterion;

a water-miscible organic solvent; and greater than 10% by weight of base comprising potassium hydroxide, wherein the etching solution is free of solid materials, fluoride, oxidizers, peroxides, inorganic acids, and organic acids, and rinsing the substrate.

\* \* \* \* \*